US009494635B2

(12) United States Patent
Laaksonen

(10) Patent No.: US 9,494,635 B2
(45) Date of Patent: Nov. 15, 2016

(54) ISLANDING DETECTION IN ELECTRICITY DISTRIBUTION NETWORK

(71) Applicant: ABB TECHNOLOGY AG, Zurich (CH)

(72) Inventor: Hannu Laaksonen, Vaasa (FI)

(73) Assignee: ABB Schweiz AG, Baden (CH)

(*) Notice: Subject to any disclaimer, the term of this patent is extended or adjusted under 35 U.S.C. 154(b) by 231 days.

(21) Appl. No.: 14/501,912

(22) Filed: Sep. 30, 2014

(65) Prior Publication Data

US 2015/0015301 A1 Jan. 15, 2015

Related U.S. Application Data

(63) Continuation of application No. PCT/EP2013/056723, filed on Mar. 28, 2013.

(30) Foreign Application Priority Data

Mar. 30, 2012 (EP) .................................. 12162628

(51) Int. Cl.
*G01R 31/02* (2006.01)
*G01R 31/40* (2014.01)
*H02J 3/38* (2006.01)

(52) U.S. Cl.
CPC ............ *G01R 31/02* (2013.01); *G01R 31/40* (2013.01); *H02J 3/38* (2013.01)

(58) Field of Classification Search
CPC combination set(s) only.
See application file for complete search history.

(56) References Cited

U.S. PATENT DOCUMENTS

| 2004/0252525 | A1 | 12/2004 | Aldridge et al. |
| 2006/0004531 | A1* | 1/2006 | Ye .................... G01R 19/2513 702/60 |
| 2010/0286838 | A1 | 11/2010 | Guzman-Casillas et al. |

FOREIGN PATENT DOCUMENTS

| EP | 1 764 894 A1 | 3/2007 |
| JP | 6-141470 A | 5/1994 |
| WO | WO 02/061911 A1 | 8/2002 |

OTHER PUBLICATIONS

International Search Report (PCT/ISA/210) mailed on Jul. 14, 2014, by the European Patent Office as the International Searching Authority for International Application No. PCT/EP2013/056723.
(Continued)

*Primary Examiner* — Walter L Lindsay, Jr.
*Assistant Examiner* — Jas Sanghera
(74) *Attorney, Agent, or Firm* — Taft Stettinius & Hollister LLP

(57) ABSTRACT

A device is disclosed for detecting an islanding condition in an electricity distribution network, by receiving a signal of the electricity distribution network, and determining an islanding condition based on the received signal. The device determines a voltage total harmonic distortion change parameter for each phase component in the received signal, determines a voltage unbalance change parameter in the received signal, compares each of the voltage total harmonic distortion change parameters and the voltage unbalance change parameter to respective triggering conditions, and concludes an islanding condition to have been detected when the voltage total harmonic distortion change parameter for each phase component of the signal and the voltage unbalance change parameter fulfill their respective triggering conditions.

20 Claims, 7 Drawing Sheets

(56) References Cited

OTHER PUBLICATIONS

International Search Report (PCT/ISA/210) mailed on Jun. 5, 2014, by the European Patent Office as the International Searching Authority for International Application No. PCT/EP2013/056724.
Sung-Il Jang et al., "An Islanding Detection Method for Distributed Generations Using Voltage Unbalance and Total Harmonic Distortion of Current", IEEE Transactions on Power Delivery, vol. 19, No. 2, Apr. 2004, pp. 745-752.
A.M. Massoud et al., "Harmonoc Distortion-Based Island Detection Technique for Inverter-Based Distributed Generation", IET Renewable Power Generation, Dec. 7, 2009, vol. 3, No. 4, pp. 493-507.

* cited by examiner

ISLANDING DETECTION IN ELECTRICITY DISTRIBUTION NETWORK

RELATED APPLICATIONS

This application claims priority as a continuation application under 35 U.S.C. §120 to PCT/EP2013/056723, which was filed as an International Application on Mar. 28, 2013 designating the U.S., and which claims priority to European Application 12162628.7 filed in Europe on Mar. 30, 2012. The entire contents of these applications are hereby incorporated by reference in their entireties.

FIELD

The present disclosure relates to islanding detection in an electricity distribution network.

BACKGROUND INFORMATION

Distributed energy resource (DER) units connected to distribution networks have potential to reduce demand for distribution and transmission network capacity, reduce losses and also increase the reliability of electricity supply to customers. Also, interconnection IEDs of distributed generation (DG) should have enabling functionalities to support active management of future distribution networks and support the realization of vision from environmentally friendly, energy efficient and reliable electricity distribution systems; i.e., Smart Grids. One of the functionalities required from a DG interconnection IED is a reliable detection of islanding, also called loss-of-mains (LOM) or anti-islanding protection.

Techniques proposed for islanding detection can be generally divided into two categories: communication based methods and local detection based methods. The local detection methods include so called active methods, where the measurement points send some sort of test signal to the network. An example of such a method is disclosed in EP 1764 894. Local detection methods also include passive methods, where the measurement point looks for transient events in the network.

The benefits of communication based LOM protection are lack of non-detection zone (NDZ) near power balance situation and lack of unwanted DG trips; that is, nuisance tripping due to other network events. However, the communication based LOM detection requires high-speed operation. The main challenges of communication based transfer trip LOM schemes are availability and cost of high-speed communication as well as flexibility to network topology changes. However, if communication based methods are not available, or communication fails or is not high-speed enough, a reliable LOM method based on local detection is still required in the future, but it has to overcome the major drawbacks of traditional LOM methods.

Active local methods have in some cases been questionable, because they introduce disturbances into the distribution network which may become a serious problem when the number of DG units increases in future.

The main focus in recent years has been on the communication based methods and the active methods, and the study of passive methods has been reducing due to a belief that they could not fulfill the demands in terms of speed, reliability, and avoiding unnecessary trip decisions.

Passive methods are based on monitoring one or more system parameters locally and making a trip decision without directly interacting with the network. Known passive LOM detection methods include monitoring of frequency (f), rate-of-change-of-frequency (ROCOF/df/dt), vector shift (VS), phase jump or voltage (U). The main issues with these known methods are failure to detect islanding near power balance and nuisance tripping of DGs.

ROCOF is a commonly employed passive LOM detection technique. However, the security of ROCOF relays is continually questioned, as it is sensitive to network disturbances, leading to nuisance tripping.

This method is highlighted by way of a simulation result of FIG. 5. The x-axis shows the time in seconds, and the y-axis shows the rate of change of a frequency parameter. The axis further shows some network events. At the time moment 0.6-0.9 s, an islanding condition occurs and at 2.3 s, capacitor switching occurs at a HV/MV substation. Three faults are also shown. At 3.0-3.15 s, there is a 1-phase-to-earth fault of another feeder, at 3.9-4.05 s there is a 1-phase-to-earth fault of the same feeder, and at 4.8-4.95 s there is a 3-phase fault in another feeder.

If it is assumed that the threshold setting would be in 6 Hz/s, ROCOF would cause a tripping in the other four events, but not in the desired one that is in the islanding event.

In ROCOF-based protection, compromise often has to be made between the relay's security and dependability. Reducing the trip threshold can reduce the non-detection zone; that is, more events in the network are detected. This approach, however, could make the relays too sensitive, resulting in more nuisance trips. As FIG. 5 shows, however, finding a proper threshold value is practically impossible.

As it is difficult to select a single criterion that would work in most situations, some multi-criteria approaches have been proposed. One multi-criteria approach has been disclosed in US 2010/0286838, which uses ROCOF and frequency as parameters. The proposed method basically, however, suffers from the same issues as the single ROCOF; that is, it can be difficult to find correct settings for the threshold values such that the operation would be sensitive enough but would avoid nuisance tripping.

Thus, a reliable, local measurement based island detection algorithm without NDZ and nuisance tripping of DG units would be desirable, along with improvements to the current passive methods.

SUMMARY

A device is disclosed for detecting an islanding condition in an electricity distribution network, the device comprising: means for receiving a signal of an electricity distribution network; means for determining an islanding condition based on the received signal; means for determining a voltage total harmonic distortion change parameter for each phase component in the received signal; means for determining a voltage unbalance change parameter in the received signal; means for comparing each of the voltage total harmonic distortion change parameters and the voltage unbalance change parameter to respective triggering conditions; and means for concluding an islanding condition to have been detected when the voltage total harmonic distortion change parameter for each phase component of the signal and the voltage unbalance change parameter fulfil their respective triggering conditions.

A method is also disclosed of detecting an islanding condition in an electricity distribution network, the method comprising: receiving a signal of the electricity distribution network; determining an islanding condition based on the received signal; determining a voltage total harmonic distortion change parameter for each phase component in the received signal; determining a voltage unbalance change parameter in the received signal; comparing each of the voltage total harmonic distortion change parameters and the voltage unbalance change parameter to respective triggering conditions; and concluding an islanding condition to have been detected when the voltage total harmonic distortion change parameter for each phase component of the signal and the voltage unbalance change parameter fulfil their respective triggering conditions.

BRIEF DESCRIPTION OF THE DRAWINGS

In the following disclosure, features will be described in greater detail by way of exemplary embodiments with reference to the accompanying drawings, in which.

DETAILED DESCRIPTION

Figure 1:
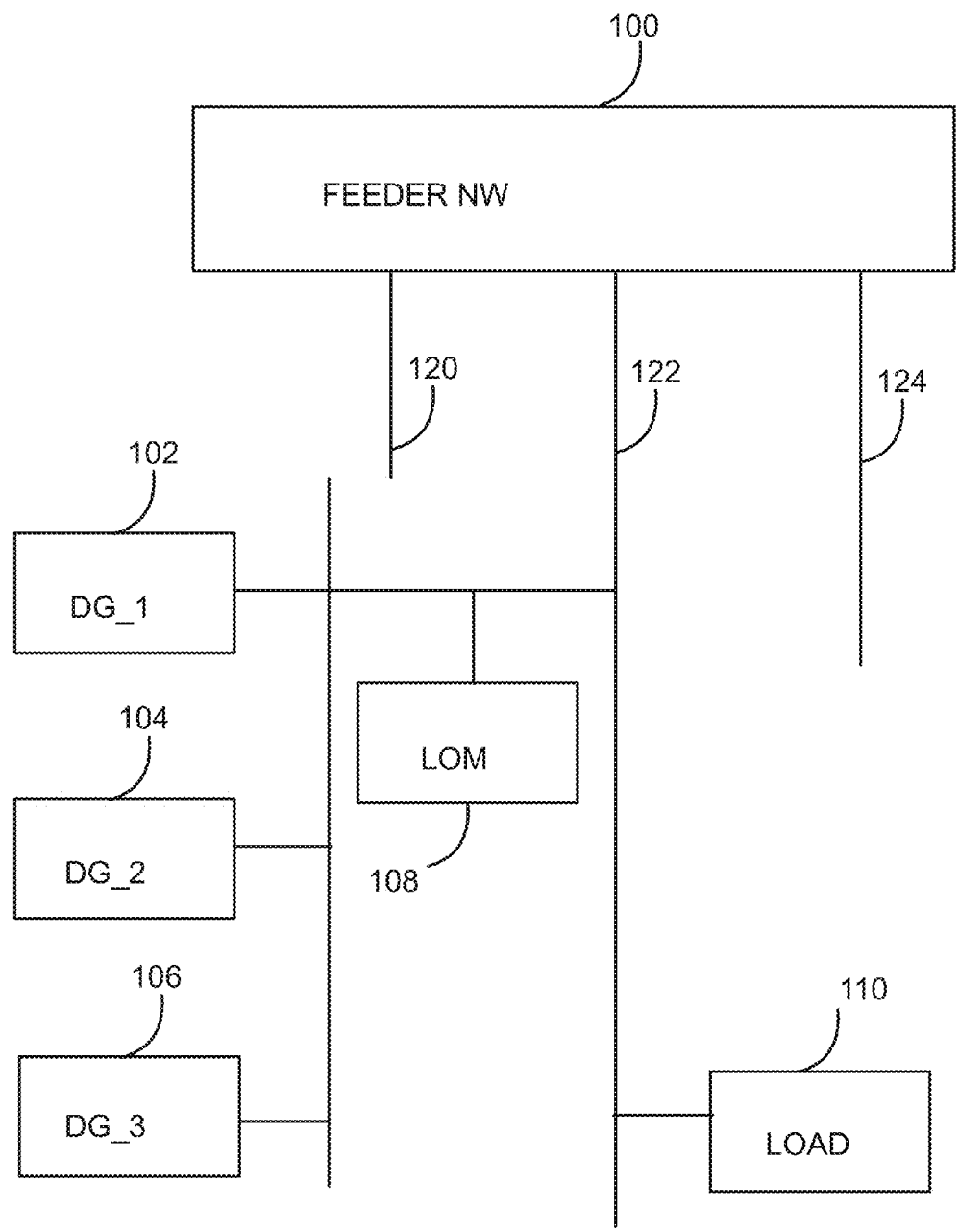
FIG. 1 shows an exemplary embodiment of an electricity distribution network.

An electricity distribution network device and a method are disclosed which can alleviate the issues already discussed.

According to exemplary embodiments of the present disclosure, a decision of an islanding condition is based on measurement of change in voltage total harmonic distortion (THD), and change of voltage unbalance.

The voltage THD is measured for a number of harmonic components, which may be 15, for example. The number of components is not limited to 15, but may be 10, 25 or 30, for example. The THD can be determined for each phase component (a, b, c) in a three-phase signal.

A reason for using voltage THD is that variations in the amount and configuration of a load might result in different harmonic currents in the network, especially when the system has converter based DGs. In the disclosure, islanding can be detected by monitoring the change of total harmonic distortion (THD) of the terminal voltage at the DG before and after the island is formed. The monitoring is based on a predetermined threshold value, that is, the change of the voltage THD can be used as the decisive criteria. It can be required that the change be seen in all phase components of the signal.

It can for example be advantageous to apply change (delta) parameters in the decision making. A voltage THD would be such that nuisance tripping could not be avoided due to other network events and disturbances. That is, setting of an appropriate limit value that would provide satisfactory performance cannot adequately be performed.

Furthermore, it can be advantageous to apply multiple harmonic components instead of one specific harmonic, such as for example a third harmonic, in determining a tripping condition. In different electricity distribution networks with different amounts of overhead lines and cables or DG units, and based on different kinds of converters and/or generators, by using multiple harmonic components correct detection can be ensured when compared to usage of one particular harmonic.

A principle of utilizing voltage THD is that, in normal operation, the distribution network acts as a stiff (low impedance) voltage source, maintaining a low distortion voltage (THD≈0) on the DG unit terminals. Two mechanisms are expected to cause an increase in voltage THD when an island occurs. First, the impedance at the DG unit terminals changes because the low impedance distribution network is disconnected and only the local load remains. As a result, current harmonics in the DG unit output current will cause increased levels of voltage harmonics in the terminal voltage. Second, non-linear loads within the island, such as distribution step-down transformers, will be excited by the output current of the DG unit. The voltage response of the non-linear loads to the current excitation can be highly distorted.

Voltage THD can be quite a sensitive criterion, and therefore many network disturbances will be noticed. Nuisance trippings can be avoided by setting threshold limits that are sufficiently long such that fault indications which are not caused by a LOM condition will be able to disappear.

The use of change of voltage THD can have a further advantage in that it does not have a NDZ when the local load matches the DG output power; that is, in a load balance situation.

Voltage THD can be a superior criterion in LOM detection over current THD, because in certain cases with converter based DG units with good filters, a non-detection zone for current THD may exist. The current THD also can depend from the current magnitude, and when for example production of photovoltaic panels or wind turbines rapidly changes, also the current THD changes. So setting a detection limit for a current THD based LOM algorithm might be impossible to ensure satisfactory selective LOM detection.

Another criterion in the present disclosure to detect LOM is voltage unbalance. As the distribution networks can include single-phase loads, it is highly possible that after islanding, voltage unbalance will occur due to the change in network condition; e.g., transition from strong to weak grid and vice versa.

The voltage unbalance criterion can be advantageous because it can provide quickly an indication of the islanding situation, but can be immune to many of the network disturbances. The use of voltage unbalance also as a change parameter instead of a voltage unbalance threshold value can be advantageous, as the setting of a fixed threshold can be difficult in varying network structures.

The two criteria, voltage THD of all phase components and voltage unbalance complement each other, because they both rely on a natural response of the system when changing from a strong grid to a weak grid. The usage of these parameters together can make the LOM detection much faster and more reliable by confirming the LOM detection of another parameter and by improving the selectivity for example in case of connection of a capacitor bank to an HV/MV substation or in a case of unsymmetrical voltage dips or unsymmetrical faults on other MV feeders. Therefore, the non-detection zone in a power balance situation can be minimized.

Solutions of the present disclosure have likely remained unnoticed to those skilled in the art because, for example, of a lack of knowledge about detailed network behavior and a lack of appropriate realistic simulation models as well as lack of appropriate field measurements. In earlier proposals for LOM detection, more simplified models or laboratory setups with many simplifications related to types of network, loads and DG units have been made which do not adequately respond to real world conditions. It has also been known to try to find only one single parameter to be used for LOM detection. However, this task has proven to be very difficult in terms of minimizing a non-detection zone and amount of nuisance tripping. Also the trend in recent years has been to investigate more communication and active or hybrid LOM methods, whereby the focus has moved away from passive methods.

FIG. 1 shows, on a high level, an exemplary embodiment of a network topology where features of the disclosure may be applied. The simulation results discussed in subsequent figures are based on the exemplary topology of FIG. 1.

In FIG. 1, the feeder network 100 illustrates a high voltage/medium voltage (HV/MV) substation having, by way of an example, three outgoing medium voltage lines 120, 122, 124 each provided with a corresponding circuit breaker. The network elements along the second line 122 are discussed more in detail in the following.

FIG. 1 shows three distributed generators DG1, DG2, DG3 connected to the MV network. The DG unit (i.e., the generator) may for example be a directly connected synchronous generator (DG1) 102, a directly connected induction generator (DG2) 104 or a power converter interfaced DG unit (DG3) 106.

The network includes a LOM detection unit 108 which can detect various events in the network, which are also shown in the simulation figures. One such event is the opening of the circuit breaker of the second MV feeder 122, which results into a detection of a loss of mains condition in the LOM unit. Additional events can be 1-, 2- or 3-phase-to-earth faults in the second or in a neighboring feeder; that is, the first 120 or third feeder 124. Additional simulated network events include a sudden increase of load at the beginning of the second feeder, a sudden load increase near the feeder line from the DG's, a capacitor switching at the HV/MV substation, disconnection of a parallel transformer at an HV/MV substation and a sudden voltage dip in the HV network.

The load in the network is depicted by the block 110.

Figure 2:
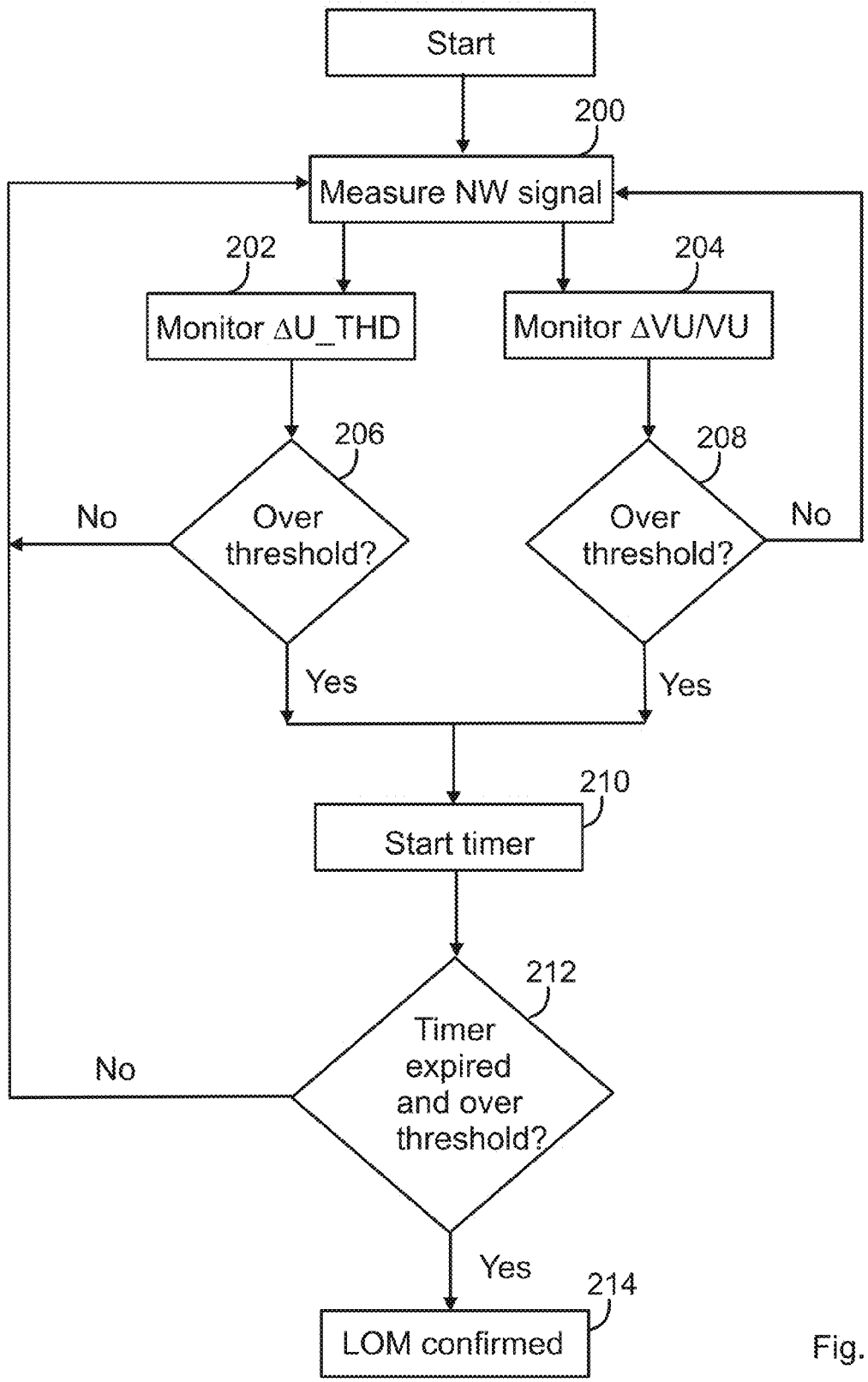
FIG. 2 shows an exemplary embodiment as disclosed herein.

FIG. 2 shows one an exemplary embodiment of a method. The method can be implemented in a power network including one or more distributed generators. For example, the method may be implemented in a protection relay or some other protective network element or inside a DG unit power converter.

In 200, a network signal is measured.

In 202, a change in voltage total harmonic distortion is determined from the measured signal. For example, the change in voltage total harmonic distortion can be determined for each phase (a, b, c) of the signal. There may a predetermined number of harmonic components that are taken into account. In this example, 15 harmonic components for each phase component are used ($U\_THD15\_a$, $U\_THD15\_b$, $U\_THD15\_c$) in the calculations, but any other number of harmonics can be selected, such as 10, 25 or 30.

Determination of a relative change of $\Delta U\_THD$ for all phase-to-ground voltages ($U\_a$, $U\_b$, $U\_c$) may be calculated as follows. The task time may be 2.5 ms and a moving average over 10 ms may be used.

The comparison of harmonic contents may be performed to a 30 ms preceding measurement value, for example. On a time moment "0" the comparison is done to values at time moment "−30 ms"; that is, $U\_THD15\_a\_t_0$, $U\_THD15\_b\_t_0$, $U\_THD15\_c\_t_0$ are compared to 30 ms earlier measurements: $U\_THD15\_a\_t_{-30}$, $U\_THD15\_b\_t_{-30}$, $U\_THD15\_c\_t_{-30}$. This comparison can, for example, be performed every 10 ms to calculate relative changes: $\Delta U\_THD15a$, $\Delta U\_THD15b$, $\Delta U\_THD15c$.

In 206, the change values are compared to respective threshold values. The threshold setting may for example be a percentage. For example, the threshold setting may be 2%, whereby if the change between the values measured at 30 ms intervals is equal to or more than 2%, a tripping indication based on the current criterion can be given.

The threshold values for different phase components may be the same. When all the comparisons of the phase components exceed the threshold value, the method proceeds to step 210 if the voltage unbalance calculation in step 204 also exceeds the threshold value therein.

In step 204, the voltage unbalance change parameter is determined. Thus, the comparison of a current value is done to an earlier value, such as a value measured 30 ms earlier, and if the change rate exceeds a threshold value, a trigger is given. For example, the comparison may be a percentage comparison, or absolute values of two measurement moments may be compared to each other. The voltage unbalance determination in 204 may be carried out simultaneously with the harmonic calculation 202. Alternatively the calculations may be dependent on each other. In such a case, only when one of the indicators exceeds the set threshold, is the other parameter calculated.

When both the harmonic comparison of 206 and the voltage unbalance comparison of 208 indicate exceeding of their threshold values, the method proceeds to step 210, where a timer is started. The purpose of the timer is to ensure that the undesired conditions in the network continue a sufficient time period. The set time period may be 80 ms, for example. This can be, for example, a sufficient time period to ensure that no faulty indications are given by the parameters. Both of the parameters may give short peaks in various network disturbances but the peaks can be filtered out with a sufficient timer. Even though the timer value suggested here is about 80 ms, the embodiments are not restricted thereto. The timer value may be selected from an exemplary range of 40 to 120 ms to provide desired advantages.

In FIG. 2, if the timer expires and both of the parameters have been over their respective threshold values for the whole time period, the method proceeds to 214 where it is confirmed that LOM has occurred. If one or both of the parameters goes below its threshold value during the timer period, the method may be reset and started anew.

The criteria shown as being applied in the method of FIG. 1 can provide substantial advantages over known methods, and meet the demands of speed, low NDZ and avoidance of nuisance tripping. These advantages and reasons thereto will be discussed in more detail in connection with the accompanying simulation results.

The loss of mains indication may result in different actions being taken. In an exemplary embodiment, the distributed generator can be shut off from the feeder network. In another embodiment, the distributed generator is permitted to continue power feeding to the main network. These different actions are discussed in FIG. 3.

Figure 3:
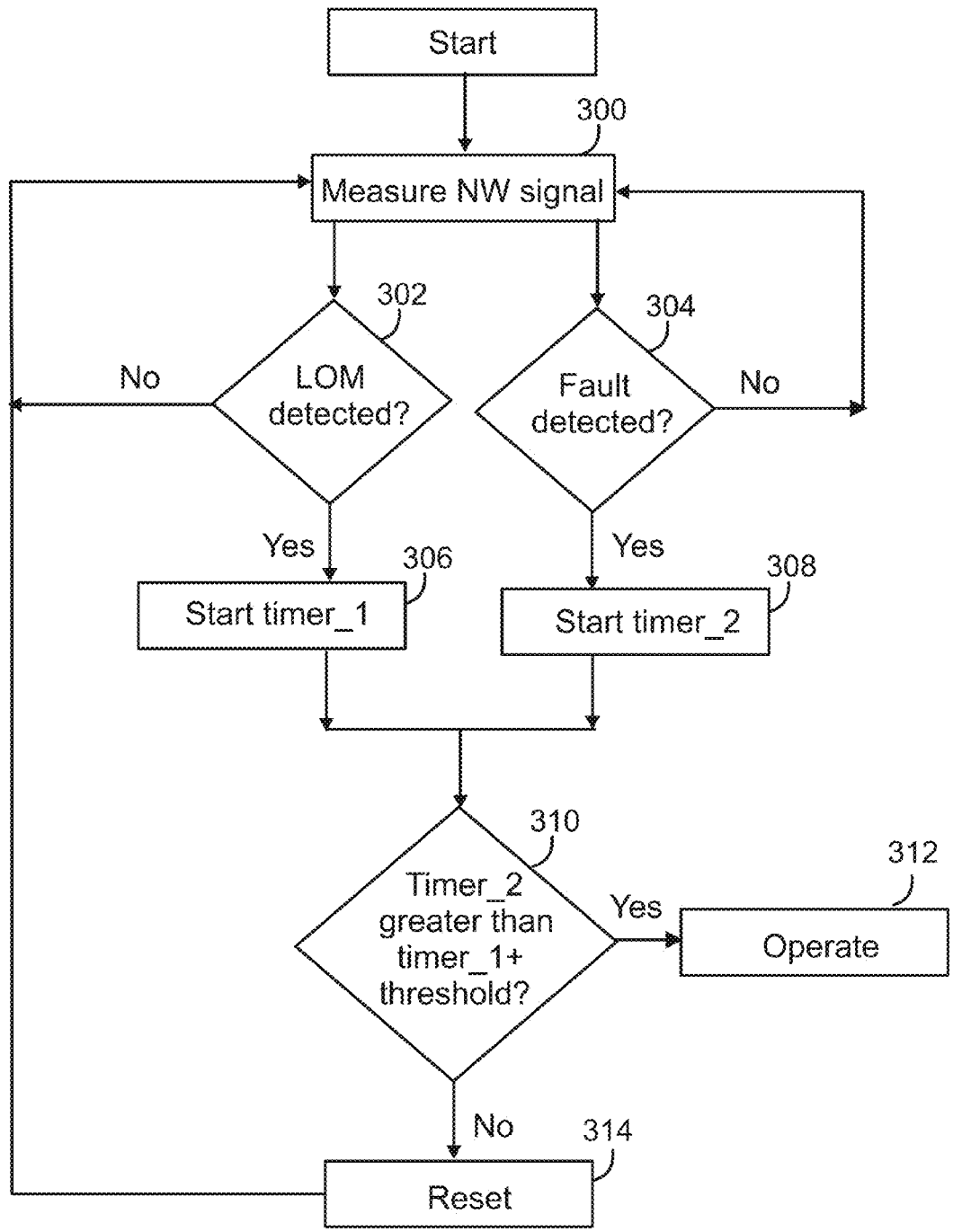
FIG. 3 shows another exemplary embodiment disclosed herein.

FIG. 3 shows an exemplary embodiment of a method where two separate functions are carried out in a protective network element, such as protective relay. The network element incorporates separate functionality for monitoring a loss of mains condition, and a function for monitoring a fault detection condition to further minimize the number of nuisance tripping of DG unit LOM detection due to faults.

In 300, an electricity distribution network signal is measured.

In 302, a loss of mains condition is measured. The detection of loss of mains condition can be carried out using the method of FIG. 2, for example.

In 304, there is provided fault detection functionality. The fault detection can be based on phase-to-earth voltages or on phase-to-phase under-voltage detection. Other possibilities for fault detection include signal/information from other protection functions, such as residual/zero voltage, ΔU_0 or U_0, different earth-fault and over-current functions or different voltage functions, such as under-voltage.

In an exemplary method, it can be evaluated if a detected islanding condition is associated with and caused a network fault condition, whereby the detection of the islanding condition would be a faulty detection.

Some network fault situations may cause the islanding detection parameters to fulfill their triggering conditions, and in this method these cases are, for example, filtered out so as to further improve the performance of the islanding detection functionality.

In an exemplary embodiment, the association between the two events, detection of an islanding condition and a network fault condition, can be determined by evaluating if the two have occurred timely close to each other.

In an exemplary embodiment, each function has a respective timer. If loss of mains is detected, timer_1 is started as indicated by step 306. If another network fault is detected, timer_2 is started as indicated by step 308.

In 310 it is checked which one of the timers started first. For example, it can be required that the timer_2 is greater than timer_1 more than a predetermined threshold value, such as 50 ms, for example. The purpose of this step is to find out if the network fault is related to the loss of mains detection or not. If the fault had occurred, for example 80 ms (more than the threshold 50 ms) before the loss of mains detection, this is an indication that there has been an islanding after a fault. This means that the fault has occurred in the same feeder which has been islanded by an operation of a feeder circuit-breaker. If this fault has been detected before islanding, this means that the island is faulty. In this situation, the method proceeds to step 312 to cause an immediate operate/triggering; that is disconnection of the island from the rest of the network.

If, on the other hand, step 310 indicates that the fault had occurred, for example, before the threshold 50 ms, the LOM detection, then the function draws a conclusion that the fault caused a false LOM detection and to avoid nuisance tripping due to false LOM detection the method goes to step 314, where the functionality is reset and the evaluation of a loss of mains condition and fault condition is restarted.

In addition to the use of FIG. 3 there are also other use cases. In one such a case, if the loss of mains functionality indicates that there is a loss of mains condition, but there is no fault according to the fault detection functionality, it may be concluded that the question is of a healthy island. There may be separate functionality to determine what to do in such a situation. If not even a healthy island can be allowed in the network, the island can be disconnected from the rest of the network. Otherwise, the healthy island may be allowed to continue feeding power to the network.

When a loss of mains has been detected, a function may be provided to determine when the loss of mains condition has been removed. In an exemplary embodiment, the removal of a loss of mains condition utilizes the similar parameters as in detection of loss of mains substantially in an inverse way. It may be monitored if the voltage unbalance parameter and the voltage total harmonic distortion parameter decline rapidly, and this declining continues a predetermined time, it is concluded that the loss of mains condition has been removed.

Figure 4:
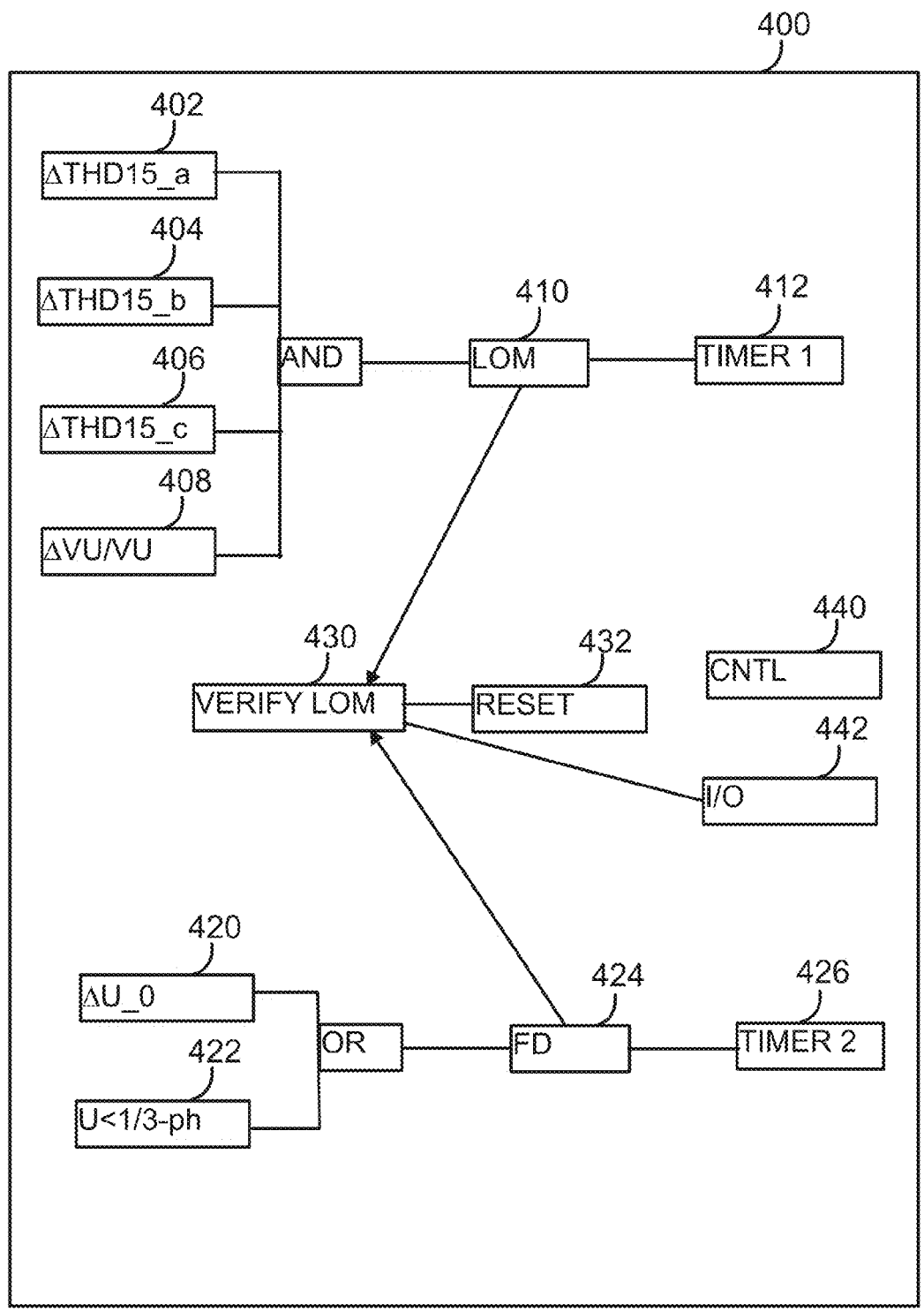
FIG. 4 shows an exemplary embodiment of an electricity distribution network device disclosed herein.

FIG. 4 shows an exemplary embodiment of a network device 400. The units 402 to 412 relate to detection of islanding or loss of mains condition, units 420 to 426 relate to a fault detection condition other than loss of mains, units 430 to 432 relate to functionality of decision making based on detections of the loss of mains and fault detection, and units 440 and 442 depict general parts of the device. The device may for example be a protective relay or some other protective device of an electricity distribution network.

The device inputs a network signal via the input/output unit 442. The unit 402 measures, from an input signal, change of voltage total harmonic distortion of 15 harmonic components of the first phase component (a) in the input signal and compares the measuring result to a predetermined triggering condition. The triggering condition may include a threshold setting value; that is if the voltage THD change exceeds a predetermined value, then a triggering condition can be deemed to be fulfilled.

Units 404 and 406 can perform the same functionality for the other two phase components (b) and (c). Unit 408 measures a voltage unbalance change parameter, which is a change value compared to one or more previous measurements. As the figure shows, there can be an AND-condition between these blocks; that is, each of the blocks 402 to 408 is to indicate loss of mains; otherwise a loss of mains detection indication is not given.

If all of the blocks 402 to 408 indicate detection of a loss of mains, a timer 412 is started. LOM coordination unit 410 then observes the expiry of the timer and that the various measurement parameters 402 to 408 stay above their respective thresholds. If this is the case, a loss of mains indication can be given. The loss of mains indication may be directed to a loss of mains verification unit 430, or the indication may be provided for the output unit 442 to disconnect the DG unit from the main network.

It is noted that the embodiment may also function without the timer such that immediately when the measured parameters exceed their threshold limits, a loss of mains indication can be given. It is also possible that different parameters have different timers. For example, total harmonic distortion, voltage unbalance, frequency change and vector shift may each have their own timers.

In addition to islanding condition/loss of mains, also other faults may occur in an electricity distribution network. Such faults can be monitored by units 420 to 426. In the embodiment of FIG. 4, a fault indication is given if one of blocks 420 (earth fault indication) or 422 (voltage drop of one of the phases) gives a fault indication. The fault detection coordination unit 424 starts a timer 426 when at least one of the blocks 420 or 422 gives such an indication. The fault detection coordination unit 426 monitors the expiry of the timer and whether the parameters measured in 420, 422 stay over their respective threshold levels. As an output, the block 424 can either give an indication of a network fault or does not indicate a fault.

There is also provided a set of blocks 430 to 434, which can make decisions based on the eventual loss of mains and/or fault detection conditions. The loss of mains verification unit 430 receives inputs from the loss of mains and fault detection coordination units 410, 424 and monitors whether fault indications from the two are substantially simultaneous. An exemplary purpose can be to filter out the effects of other network faults from the loss of mains detection.

In an exemplary embodiment, the unit 430 compares the timers run in blocks 412 and 426 and gives outputs based on the comparison. If, for example, a network fault was detected well before the islanding condition, it may be concluded that the network island is a faulty island and should be disconnected immediately.

Otherwise, if it noticed that the timer_2 is less than 50 ms greater than timer_1, it may be concluded that the loss of mains indication given by the blocks 402 to 408 may be incorrect. In such a case the loss of mains indication, that is exceeding of threshold values (THD, VU) can take place for example due to a network fault, such as a fault on a neighboring feeder.

The unit 430 may also monitor that a network fault has been removed more than a predetermined time period, e.g. 50 ms, before a LOM condition is fulfilled. This is due to the case that when a neighboring feeder is disconnected due to a 3-phase fault, for example, this may cause a temporary exceeding of LOM criteria. In this way it may be avoided that an erroneous "healthy island" indication is given, for example, due to fault clearance on other feeders; that is, when there is no network fault but there exists a LOM condition for a short moment. Otherwise, fault clearance on other feeders could possibly lead to nuisance tripping especially if very fast LOM detection is required or preferred, as for example a LOM detection in less than 100 ms.

The implementation of the fault detection functionality in connection with the LOM functionality can provide an important advantage in that the performance of the LOM functionality can be further improved, and to further ensure selective operation and to avoid nuisance trippings. That is, some LOM indications which actually do not represent a LOM condition can be avoided.

In FIG. 4, the unit 440 depicts a general controller unit of the device. The controller may be implemented on a processor of the device, for example.

In the following FIGS. 5 to 7, some exemplary simulation results are discussed. The time scale shown on the x-axis and the events in the figures are the same. The simulation network is on a coarse level the one presented in FIG. 1.

The simulation sequence in FIGS. 5 to 7 was as follows:
Islanding at (0.6-0.9 s) in almost perfect power balance (ΔP and ΔQ at the beginning of MV feeder are zero; i.e., power flow from the utility grid to the MV feeder is almost zero)
Events or disturbances which should not lead to tripping decision of LOM detection (i.e., nuisance tripping):
 i. Sudden load increase at the beginning of the feeder, passive balanced load (1.4 s)
 ii. Sudden load increase near the PCC of the MV feeder DG unit, passive balanced load (1.6 s)
 iii. Operation of on-load-tap-changer at HV/MV substation, (1.8 s)
 iv. Capacitor switching at HV/MV substation, 0.4 MVAr (2.3 s)
 v. Disconnection of parallel transformer at HV/MV substation (2.6 s)
 vi. 1-phase-to-earth (A-G) fault 150 ms at the end of adjacent MV feeder (fault resistance $R_f$=750 ohm) (3.0-3.15 s)
 vii. 1-phase-to-earth (B-G) fault 150 ms at the beginning of adjacent MV feeder (fault resistance $R_f$=100 ohm) (3.45-3.6 s)
 viii. 1-phase-to-earth (A-G) fault 150 ms in the middle of the same MV feeder (fault resistance $R_f$=1000 ohm) (3.9-4.05 s)
 ix. 2-phase (A-B) fault 150 ms in the middle of adjacent MV feeder (fault resistance $R_f$=5 ohm) (4.35-4.5 s)
 x. 3-phase (A-B-C) fault 150 ms at the beginning of adjacent MV feeder (fault resistance $R_f$=1 ohm) (4.8-4.95 s)
 xi. 3-phase 30% voltage dip in HV network (5.3-5.45 s)

Figure 5:
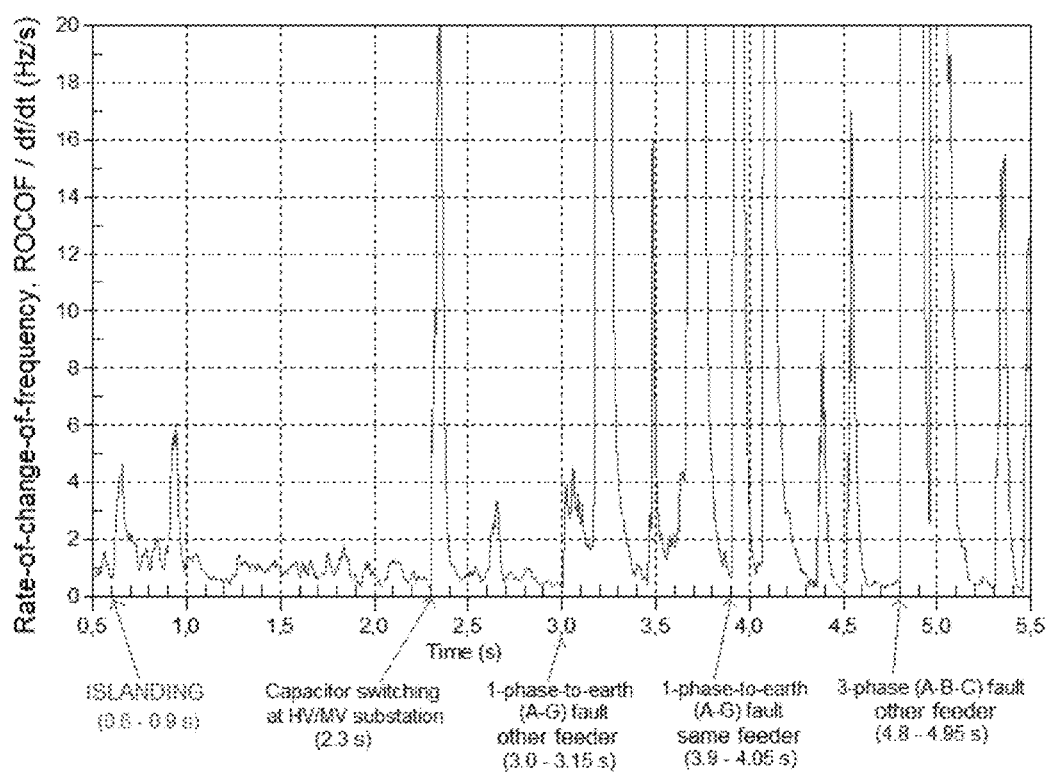
FIG. 5 shows an exemplary simulation result when ROCOF is used according to an exemplary embodiment disclosed herein.

FIG. 5 illustrates the results of a detection arrangement, where the measurement is based on frequency using rate-of-change of frequency (ROCOF).

When detecting an islanding condition, using ROCOF, in almost a perfect power balance situation occurring at 0.6 to 0.9 seconds, it is noticed that the method produces a first peak, after which the level drops considerably. The time period 0.7 to 0.9 can be considered problematic, because the exemplary method should still consider this level of signal as fulfilling the islanding condition. Therefore, the threshold level should be set low enough.

Other indicated network events can also produce high peaks, such as faults and fault clearances on adjacent feeders. Therefore nuisance trippings can be very probable especially when high-speed LOM detection is required. As FIG. 5 shows, finding a proper threshold value for LOM detection based on ROCOF can be practically impossible.

Figure 6:
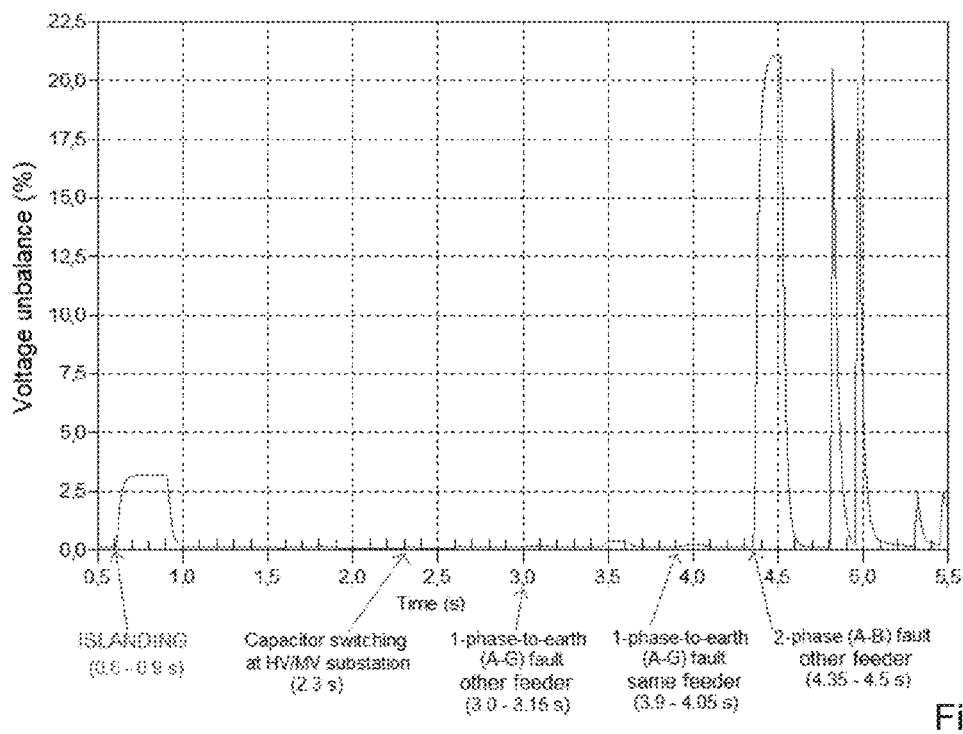
FIG. 6 shows an exemplary simulation result using voltage unbalance according to an exemplary embodiment disclosed herein.

In FIG. 6 voltage unbalance (VU) or change in VU values during the simulation sequence are presented. From FIG. 6 it can be seen that voltage unbalance alone is not a fully sufficient criterion for island detection, because for example 2-phase faults at adjacent feeders would lead to unwanted tripping of DG units.

Figure 7A:
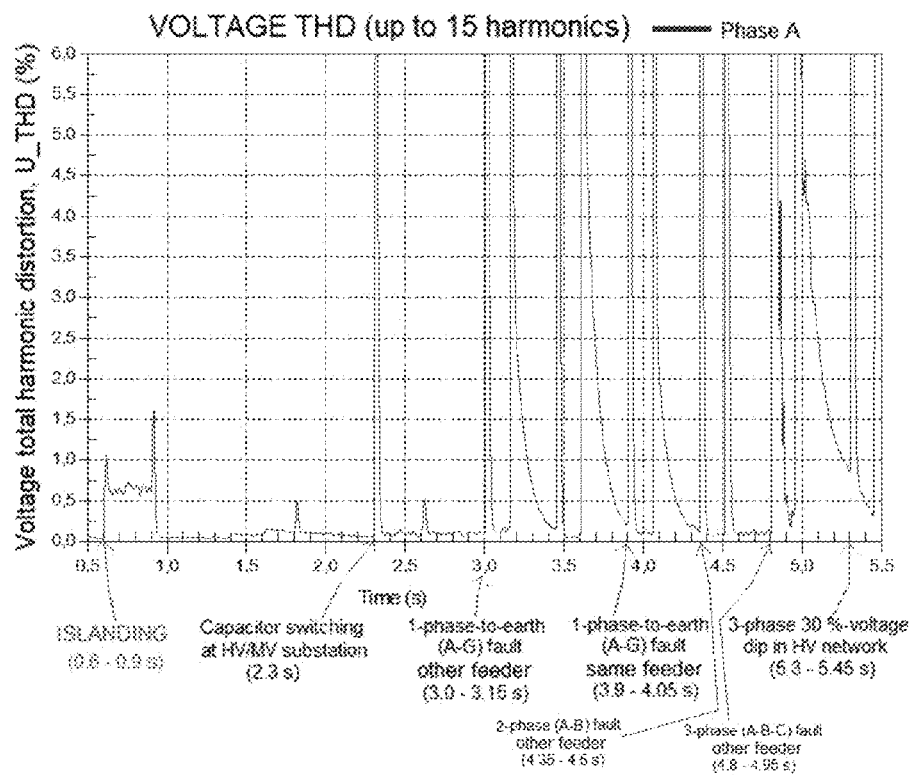
FIG. 7A shows an exemplary simulation result of a first phase of voltage total harmonic distortion according to an exemplary embodiment disclosed herein.
Figure 7B:
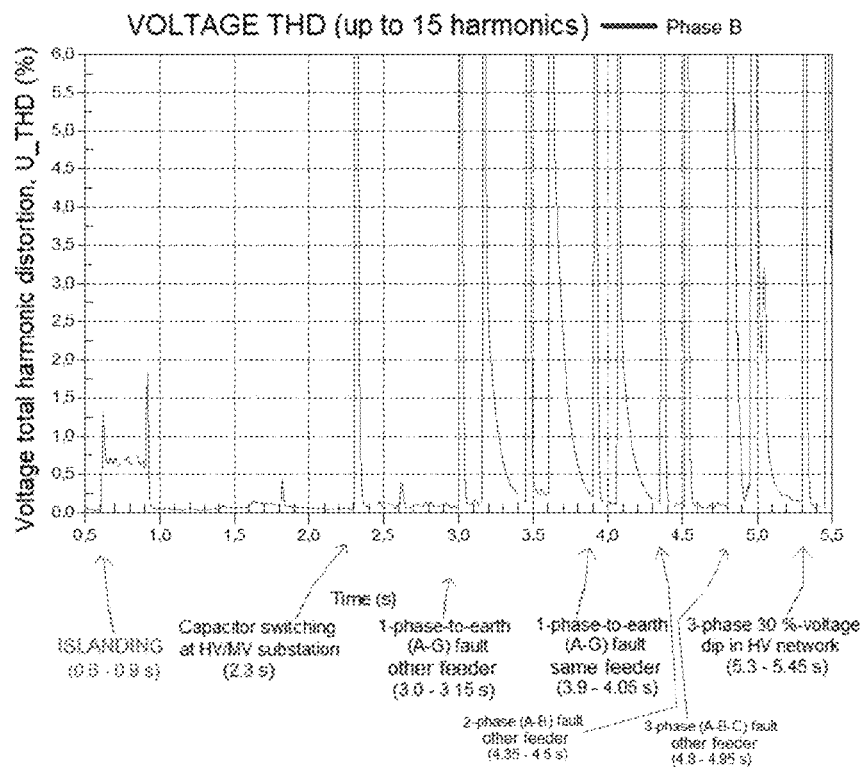
FIG. 7B shows an exemplary simulation result of a second phase of voltage total harmonic distortion according to an exemplary embodiment disclosed herein.
Figure 7C:
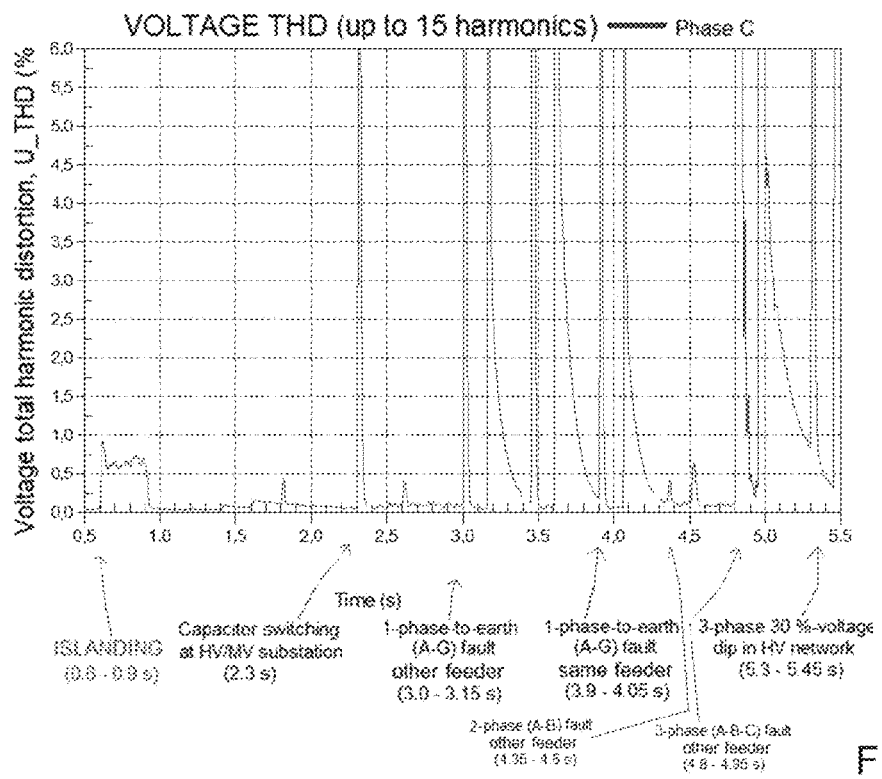
FIG. 7C shows an exemplary simulation result of a third phase of voltage total harmonic distortion according to an exemplary embodiment disclosed herein.

In FIGS. 7A to 7C, the voltage THD (%) values including harmonics up to 15th harmonic from phases A, B and C during the simulation sequence are shown. It can be seen that if change in multiple harmonics from all phase voltages A, B and C are used alone for high-speed islanding detection, there is a risk that for example capacitor switching at HV/MV substation (2.3 s) or a clearance of faults on adjacent feeders could cause nuisance tripping. If only multiple harmonics from one phase voltage would be used for LOM detection, the number of nuisance trippings would be even further increased. Therefore it can, for example, be preferred to utilize multiple harmonics from all phase voltages as part of the LOM detection.

Due to above mentioned reasons, the usage of a change parameter in voltage THD values from all phases together with a change parameter of voltage unbalance for LOM detection can tremendously improve the selectivity and reduce nuisance trippings of LOM detection.

By utilization of fault detection information, the selective operation of an LOM algorithm can be even further ensured and improved. In case of a 150 ms 2-phase (A-B) fault in the middle of an adjacent MV feeder (fault resistance $R_f$=5 ohm) (4.35-4.5 s), LOM detection can be prevented by applying fault detection based on one of a phase-to-earth or a phase-to-phase voltage under-voltage (e.g., 0.95 pu) criterion, as illustrated by FIGS. 6 and 7. Other possibilities which could be used for preventing a LOM detection, are a difference between voltage THD in a remaining healthy phase (C) when compared to two faulty phases B and C (see FIGS. 7A to 7C) or LOM detection prevention when voltage unbalance upper limit, e.g., 10%, is exceeded.

On the other hand, to avoid a false "Healthy island detection" for example after clearance of a 3-phase fault on the other feeder (4.8-4.95 s), the fault detection status could be "no fault" for an exemplary period of 50 ms before Start time 1 of timer_1 for LOM detection when high-speed detection of LOM is required. In accordance with an exemplary embodiment, such as FIG. 4, the protection relay may include a processor, which can be a general-purpose processor configured as a specially programmed computer to execute a computer program tangibly recorded on a non-transitory computer-readable recording medium, for example, a ROM, hard disk drive, optical memory or flash memory. In this case, the general-purpose processor can be configured to carry out the operative functions described herein by executing the computer program recorded on the non-transitory computer-readable recording medium. In accordance with an exemplary embodiment, the processor can be an application specific processor that is specifically configured to carry out the operative functions described herein. The non-transitory computer-readable recording medium can be a memory resident in the protective relay and/or communicatively connected to the protective relay.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A device for detecting an islanding condition in an electricity distribution network, the device comprising:
   means for receiving a signal of an electricity distribution network;
   means for determining an islanding condition based on the received signal;
   means for determining a voltage total harmonic distortion change parameter for each phase component in the received signal;
   means for determining a voltage unbalance change parameter in the received signal;
   means for comparing each of the voltage total harmonic distortion change parameters and the voltage unbalance change parameter to respective triggering conditions; and
   means for concluding an islanding condition to have been detected when the voltage total harmonic distortion change parameter for each phase component of the signal and the voltage unbalance change parameter fulfill their respective triggering conditions.

2. A device according to claim 1, wherein the triggering condition for one or more parameters includes a threshold setting.

3. A device according to claim 2, comprising:
   a timer for one or more parameters of the triggering condition, the triggering condition being fulfilled when the parameter stays above the threshold setting for a time period of the timer.

4. A device according to claim 3, wherein the device comprises:
   means for monitoring faults other than a loss of mains condition of an electricity distribution network;
   means for evaluating if there is a network fault in connection with the detection of the islanding condition; and
   means for giving an islanding indication upon the islanding detection when there is no associated network fault with the islanding detection.

5. A device according to claim 4, wherein the device comprises:
   means for restarting the islanding detection when there is an associated network fault with the detected islanding condition.

6. A device according to claim 5, wherein the device comprises:
   means for concluding that the islanding detection is associated with a network fault when the two occur within a predetermined time frame.

7. A device according to claim 6, wherein the device comprises:
   means for monitoring disappearance of the islanding condition which uses substantially inverse criteria relative to the detection of the islanding condition.

8. A device according to claim 1, comprising:
   a timer for one or more parameters of the triggering condition, the triggering condition being fulfilled when the parameter stays above the threshold setting for a time period of the timer.

9. A device according to claim 1, wherein the device comprises:
   means for monitoring faults other than a loss of mains condition of an electricity distribution network;
   means for evaluating if there is a network fault in connection with the detection of the islanding condition; and
   means for giving an islanding indication upon the islanding detection when there is no associated network fault with the islanding detection.

10. A device according to claim 1, wherein the device comprises:
    means for restarting the islanding detection when there is an associated network fault with the detected islanding condition.

11. A device according to claim 1, wherein the device comprises:
    means for concluding that the islanding detection is associated with a network fault when the two occur within a predetermined time frame.

12. A device according to claim 1, wherein the device comprises:
    means for monitoring disappearance of the islanding condition which uses substantially inverse criteria relative to the detection of the islanding condition.

13. A method of detecting an islanding condition in an electricity distribution network, the method comprising:
    receiving a signal of the electricity distribution network;
    determining an islanding condition based on the received signal;
    determining a voltage total harmonic distortion change parameter for each phase component in the received signal;
    determining a voltage unbalance change parameter in the received signal;
    comparing each of the voltage total harmonic distortion change parameters and the voltage unbalance change parameter to respective triggering conditions; and concluding an islanding condition to have been detected when the voltage total harmonic distortion change parameter for each phase component of the signal and the voltage unbalance change parameter fulfil their respective triggering conditions.

14. A method according to claim 13, wherein the triggering condition for one or more parameters includes a threshold setting.

15. A method according to claim 13, wherein the triggering condition for one or more parameters includes a timer function, the triggering condition being fulfilled when the parameter stays above the threshold setting for a time period of a timer.

16. A method according to claim 13, comprising:

monitoring network faults other than a loss of mains condition in the electricity distribution network;

evaluating if there is a network fault in connection with the detection of the islanding condition; and giving an islanding indication upon the islanding detection when there is no associated network fault with the islanding detection.

17. A method according to claim 13, comprising:

restarting the islanding detection when there is an associated network fault with the detected islanding condition.

18. A method according to claim 13, comprising:

concluding that the islanding detection is associated with a network fault when the two occur within a predetermined time frame.

19. A method according to claim 13, comprising:

monitoring disappearance of the islanding condition with substantially inverse criteria relative to those used in the detection of the islanding condition.

20. A computer program product for non-transitory storing of a computer program which, when executed by a computer will configure the computer to perform the method according to claim 13.

* * * * *